US008198532B2

(12) United States Patent
Chen et al.

(10) Patent No.: US 8,198,532 B2
(45) Date of Patent: Jun. 12, 2012

(54) MEDIA DISTRIBUTION HUB AND PROTECTION CASE

(75) Inventors: David Zhi Chen, Richardson, TX (US); Mark Anthony Ali, Cockeysville, MD (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 252 days.

(21) Appl. No.: 12/638,634

(22) Filed: Dec. 15, 2009

(65) Prior Publication Data

US 2011/0139480 A1 Jun. 16, 2011

(51) Int. Cl.
*H05K 5/00* (2006.01)

(52) U.S. Cl. ......... 174/50; 174/17 R; 439/535; 248/906; 361/600

(58) Field of Classification Search .................... 174/50, 174/17 R; 439/535; 248/906; 361/600; 220/4.02
See application file for complete search history.

(56) References Cited

U.S. PATENT DOCUMENTS 2,871,457 A * 1/1959 Jencks et al. .................. 439/370
7,247,791 B2 * 7/2007 Kulpa ............................ 174/50

* cited by examiner

*Primary Examiner* — Dhirubhai R Patel

(57) ABSTRACT

A media distribution hub including a housing including a first housing member and a second housing member configured for releasable sealing engagement with one another. A sleeve is disposed about the housing, and is configured to lock the first housing member and the second housing member together and to provide a seal about the first and second housing members. A media retaining mat is disposed within the housing. A plurality of fasteners are also included, at least one of the fasteners configured for engagement with the first housing member, and at least one of the fasteners configured for engagement with the second housing member.

25 Claims, 6 Drawing Sheets

MEDIA DISTRIBUTION HUB AND PROTECTION CASE

BACKGROUND

When routing communication-based media including cable, wires and strands to a particular destination a media installation is typically provided outside of the destination in which media connections are made. It is becoming more common for such media installations to be buried underground for aesthetic purposes. However, if water/moisture, dirt or other contaminants were to get into a media installation and interact with the media signal loss or interruption could occur.

DETAILED DESCRIPTION

Figure 1:
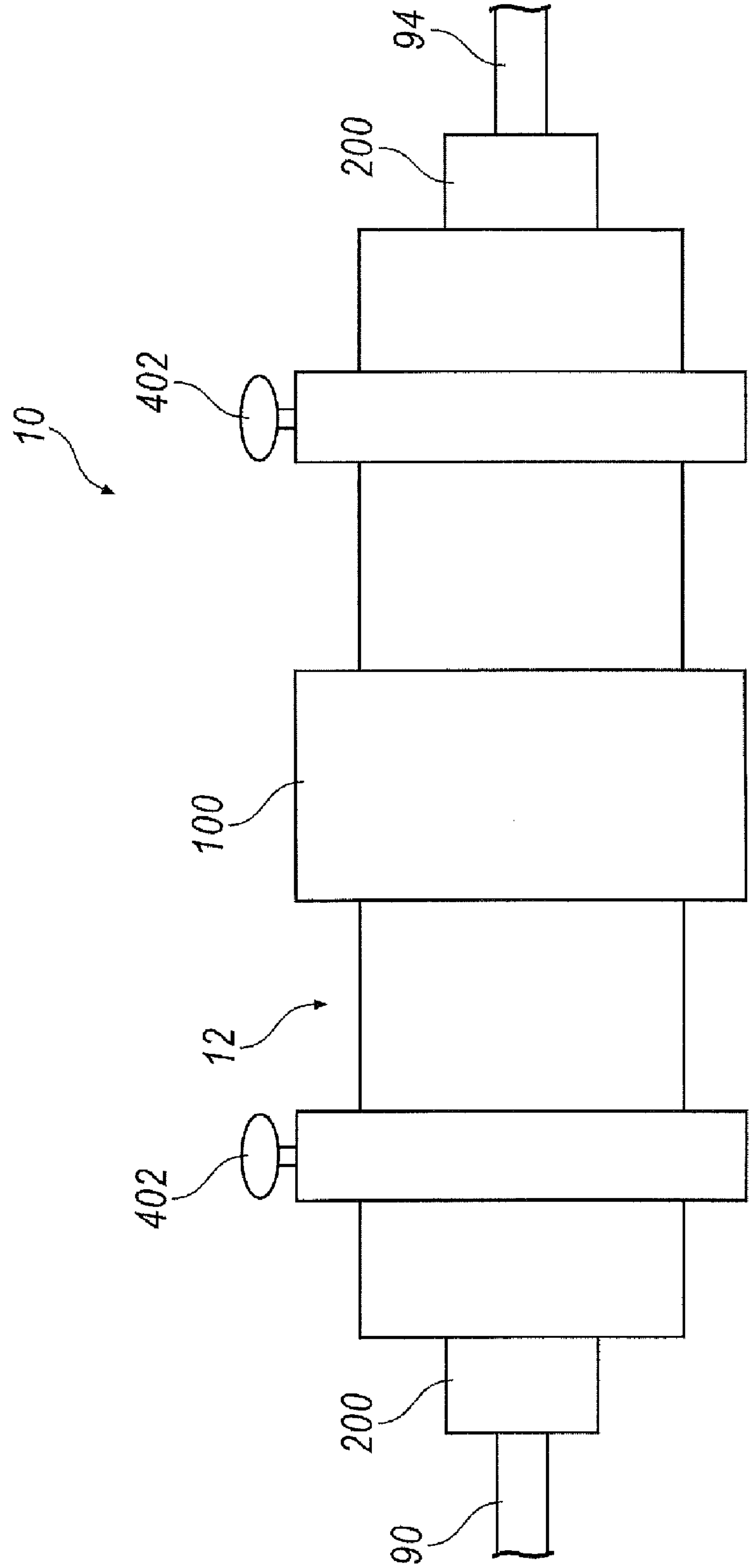
FIG. 1 is a planar view of a media distribution hub.

Referring now to the discussion that follows and also to the drawings, illustrative approaches to the disclosed apparatuses and methods are shown in detail. Although the drawings represent some possible approaches, the drawings are not necessarily to scale and certain features may be exaggerated, removed, or partially sectioned to better illustrate and explain the disclosed device. Further, the descriptions set forth herein are not intended to be exhaustive or otherwise limit or restrict the claims to the precise forms and configurations shown in the drawings and disclosed in the following detailed description.

Figure 2:
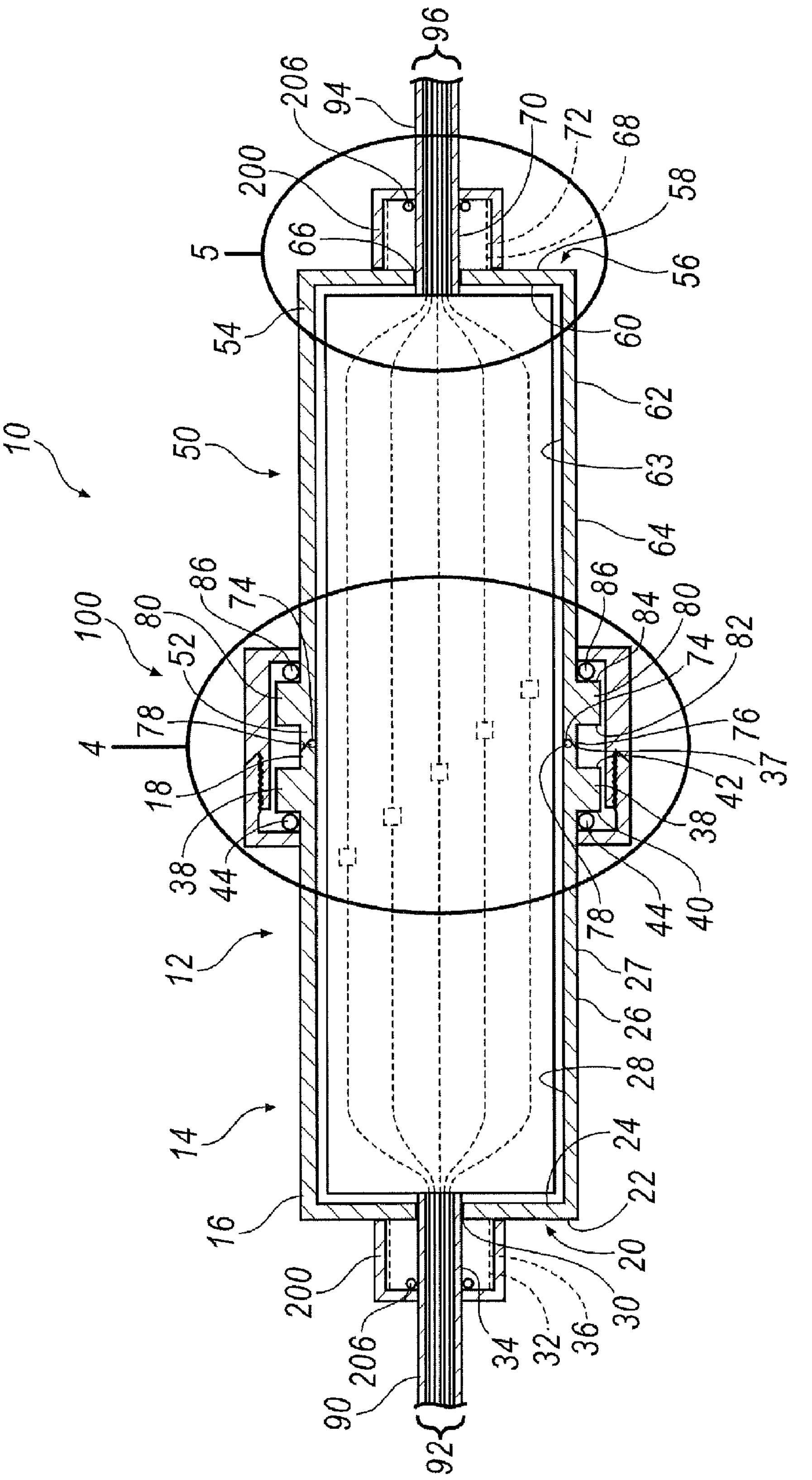
FIG. 2 is a cross sectional view of the media distribution hub of FIG. 1.

As seen in FIGS. 1-2, media distribution hub 10 is configured to receive a plurality of communication-based media 92, 96, such as fiber optic cables, coaxial cables, wires, or strands. Media distribution hub 10 includes a housing 12, a sleeve 100 disposed about housing 12, fasteners such as illustrated in an exemplary form as locking nuts 200 on the ends of the media distribution hub 10, and a media retaining mat 300 contained within the housing 12. Media distribution hub 10 receives media 92, 96 such that media distribution hub 10 may be buried underground while protecting media connections made within the media distribution hub 10 from exposure to contaminants such as water and dirt.

In the exemplary illustration, housing 12 includes a first housing member 14 and a second housing member 50, which may releasably mate with one another. As illustrated, first housing member 14 is a generally cylindrical hollow tube having a first end 16 and a second free end 18. First housing member 14 includes a base 20 having an outer surface 22 and an inner surface 24 at the first end 16 of first housing member 14. An annular wall 26 having an outer surface 27 and an inner surface 28 extends away from the inner surface 24 of the base 20.

Base 20 includes at least one aperture 30 intersecting the outer and inner surfaces 22, 24 of the base 20. A base projection 32, which includes a bore 34, extends from the outer surface 22 of the base 20 about aperture 30 such that bore 34 is at least generally aligned with aperture 30. In the exemplary illustration, base projection 32 also includes an external thread 36 for engagement with a corresponding threaded locking nut 200 as discussed below. Aperture 30 and bore 34 are sized to receive a cable 90, which houses a plurality of media 92, as shown in FIG. 2.

At the second end 18 of the first housing member 14, annular wall 26 tapers inwardly from one of the outer surface 27 of the annular wall 26 and the inner surface 28 of the annular wall 26, such that a first beveled edge 37 is formed.

Proximate the second end 18 of the first housing member 14, an annular flange 38 having a first face 40 and a second face 42 is disposed about and may be formed integral with the outer surface 27 of the annular wall 26. A first sleeve sealing member 44, such as a washer or an O-ring, is disposed about the outer surface 27 of annular wall 26 such that first sleeve sealing member 44 is disposed against the first face 40 of annular flange 38.

Second housing member 50 is a generally cylindrical hollow tube having a first free end 52 and a second end 54. Second housing member 50 includes a base 56 having an outer surface 58 and an inner surface 60 at the second end 54 of second housing member 50. Second housing member 50 is configured such that the diameter of the second housing member 50 generally corresponds to the diameter of the first housing member 14. An annular wall 62 having an inner surface 63 and an outer surface 64 extends away from the inner surface 60 of the base 56.

Base 56 includes at least one aperture 66 intersecting the inner and outer surfaces 58, 60 of the base 56. A base projection 68, which includes a bore 70, extends from the outer surface 58 of the base 56 about aperture 66 such that bore 70 is at least generally aligned with aperture 66. Base projection 68 is shown with an external thread 72 for engagement with a corresponding threaded locking nut 200 as discussed below. Aperture 66 and bore 70 are sized to receive a cable 94, which houses a plurality of media 96, as shown in FIG. 2.

At the first end 52 of the second housing member 50, annular wall 62 includes a shoulder 74, from which annular wall 62 tapers outwardly with respect to the outer surface 64 of the annular wall 62, such that a second beveled edge 76 is formed that is complementary to beveled edge 37 of first housing member 14. Beveled edge 76 corresponds to the beveled edge 37 of the second end 18 of the first housing member 14. A housing sealing member 78, such as a washer or O-ring, is disposed between end 18 of first housing member 14 and end 52 of second housing member 50 such that housing sealing member 78 is secured by the beveled edge 76, shoulder 74, and beveled edge 37 in the illustrated approach.

Proximate the first end 52 of the second housing member 50, an annular flange 80 having a first face 82 and a second face 84 is disposed about and may be formed integral with the outer surface 64 of the annular wall 62. A second sleeve sealing member 86, such as a washer or an O-ring, is disposed about the outer surface 64 of annular wall 62 such that second sleeve sealing member 86 is disposed against the second face 84 of annular flange 80.

Figure 4:
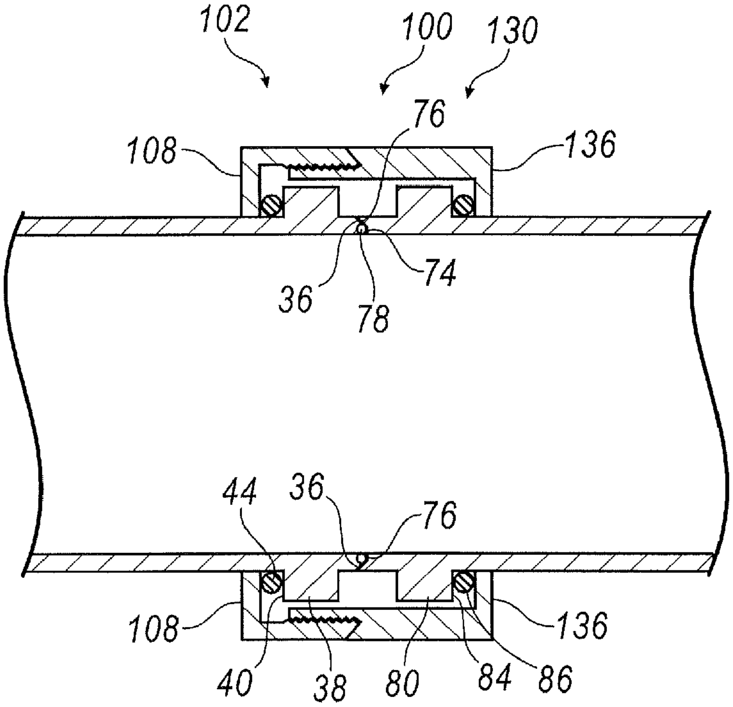
FIG. 4 is a cross-sectional view of a portion of the media distribution hub illustrated in FIG. 2.

In the illustrated approach, to mate the first housing member 14 with the second housing member 50 as shown in FIGS. 2 and 4, the beveled edge 37 of the first housing member 14 is brought into engagement with the beveled edge 76 of the second housing member 50. Beveled edge 37 slides along beveled edge 76 until beveled edge 37 contacts shoulder 74. As housing sealing member 78 is disposed against shoulder 74 and beveled edge 76, housing sealing member 78 presses against beveled edge 37 proximate the point at which the beveled edge 37 contacts the shoulder 74. Housing sealing member 78 thus serves to seal the connection point of the first housing member 14 and the second housing member 50 and prevent contaminants from entering into housing 12 through the connection point.

As seen in FIGS. 1-4, media distribution hub 10 also includes a sleeve 100 disposed about housing 12. Sleeve 100 may be a generally cylindrical hollow tube including a first sleeve member 102 and a second sleeve member 130. First sleeve member 102 may be a generally cylindrical hollow tube having a first end 104 and a second end 106. First sleeve member 102 includes a base 108 at the first end 104 of the first sleeve member 102 and an annular wall 110 extending away from the base 108. Base 108 includes an aperture 112, which is sized to receive first housing member 14. First sleeve member 102 is disposed about the first housing member 14 such that annular flange 38 is located between the first sleeve member 102 and the second end 18 of the first housing member 14.

Second sleeve member 130 is a generally cylindrical hollow tube having a first end 132 and a second end 134, and includes a base 136 at the second end 134 of the second sleeve member 130 and an annular wall 138 extending away from the base 136. Base 136 includes an aperture 140, which is sized to receive second housing member 50. Second sleeve member 130 is disposed about the second housing member 50 such that annular flange 80 is located between the second sleeve member 130 and the first end 52 of the second housing member 50.

Figure 3:
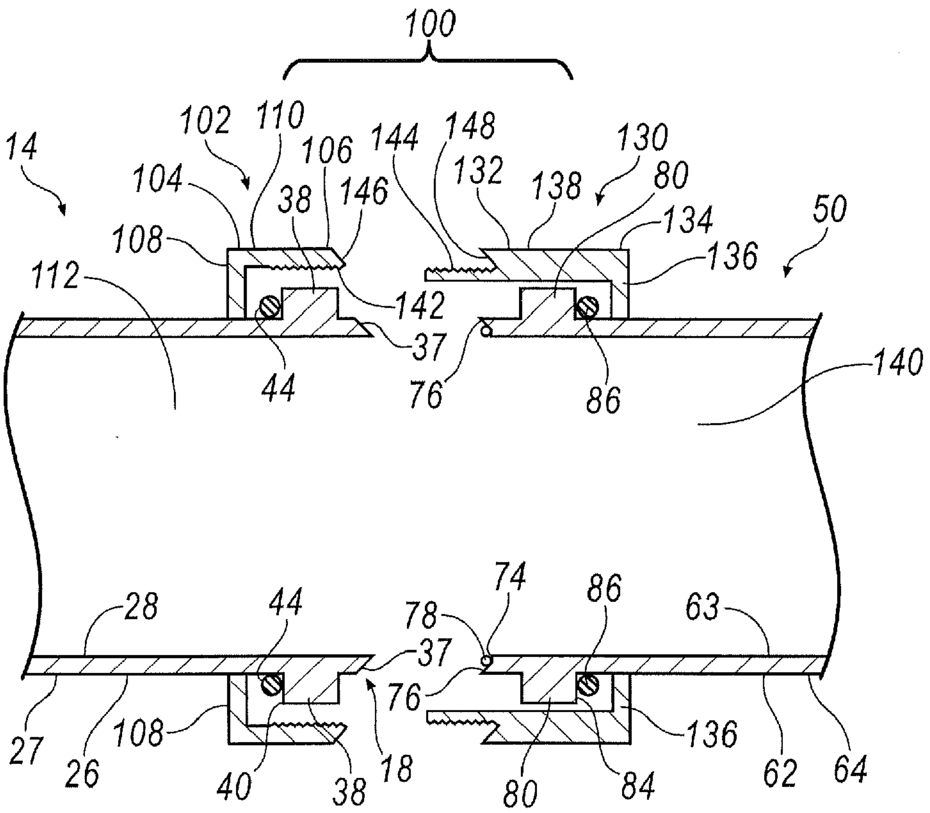
FIG. 3 is an exploded cross-sectional view of a portion of the media distribution hub illustrated in FIG. 1

As shown in FIG. 3, the second end 106 of first sleeve member 102 may include a thread 142, and the first end 132 of second sleeve member 130 may includes a complementary thread 144 such that the first sleeve member 102 and second sleeve member 130 can be threadedly engaged with each other. Additionally, at the second end 106 of first sleeve member 102, annular wall 110 may taper inwardly, such that a first beveled edge 146 is formed. At the first end 132 of the second sleeve member 130, annular wall 138 may taper outwardly, such that a second beveled edge 148 is formed that is complementary to first beveled edge 146.

When first sleeve member 102 and second sleeve member 130 are in threaded engagement, FIG. 4, base 108 of first sleeve member 102 is drawn into contact with first sleeve sealing member 44 such that first sleeve sealing member 44 may be sandwiched in a compressed manner between the first face 40 of annular flange 38 and base 108. Additionally, base 136 of second sleeve member 130 is drawn into contact with second sleeve sealing member 86 such that second sleeve sealing member 86 is compressed between the second face 84 of annular flange 80 and base 136. Further, the first beveled edge 146 and the second beveled edge 148 are brought into engagement with one another. The engagement of the first sleeve member 102 and the second sleeve member 130 thus locks the first and second housing members 14, 50 together, and creates an additional seal about the connection of the first and second housing members 14, 50.

Figure 5:
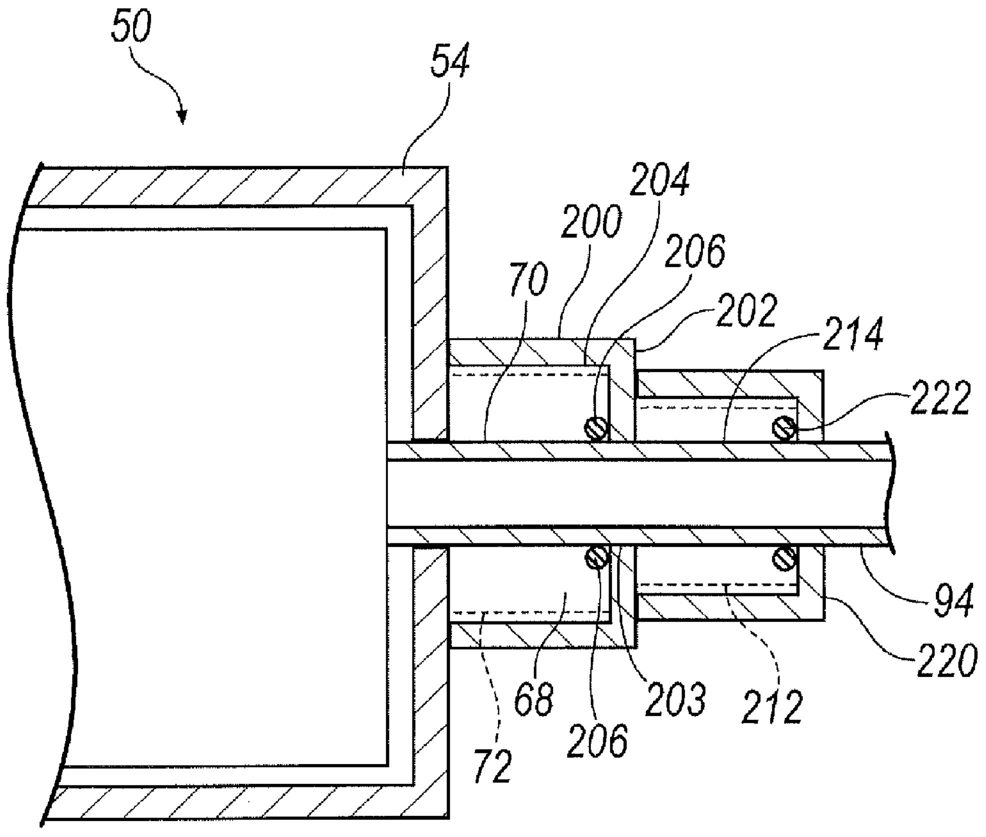
FIG. 5 is a cross-sectional view of an end portion of the media distribution hub of FIG. 2 and including a plurality of fasteners.

Media distribution hub 10 may also include a plurality of fasteners illustrated in the exemplary approach as locking nuts 200, FIGS. 2, 5. As shown in FIG. 5 with regard to the second housing member 50, locking nut 200 is disposed about cable 94, and includes an outer surface 202 including a nut bore 203 and an inner thread 204 that is threadedly engageable with the external thread 72 of the base projection 68. A base sealing member 206 may also be disposed about cable 94 such that upon engagement of the locking nut 200 with the base projection 68 base sealing member 206 is sandwiched between the locking nut 200 and base projection 68 about bore 70. Such an arrangement creates a seal to prevent contaminants from entering the housing 12 about the cable 94. Another locking nut 200 and base sealing member 206 are also engaged with the base projection 32 of the first housing member 14, creating a corresponding seal about cable 90.

To provide additional seals about the cables 90, 94 at the ends 16, 54 of the housing 12, locking nuts 200 may include a nut projection 212, FIG. 5, which includes a nut projection bore 214 therethrough. Nut projection 212 extends from the outer surface 202 of the locking nut 200 such that nut projection bore 214 is aligned with nut bore 203. An additional locking nut 220 and second base sealing member 222 may be disposed about cables 90, 94 for engagement with nut projection 212. In this manner, additional seals may be formed about the cables 90, 94 at the ends 16, 54 of the housing 12 to prevent containments from entering into the housing 12. Although only two locking nuts 200, 220 are shown at the ends 16, 54 of the housing 12, a plurality of additional locking nuts and base sealing members may be provided to form additional seals at the ends 16, 54 of the housing 12.

Figure 6:
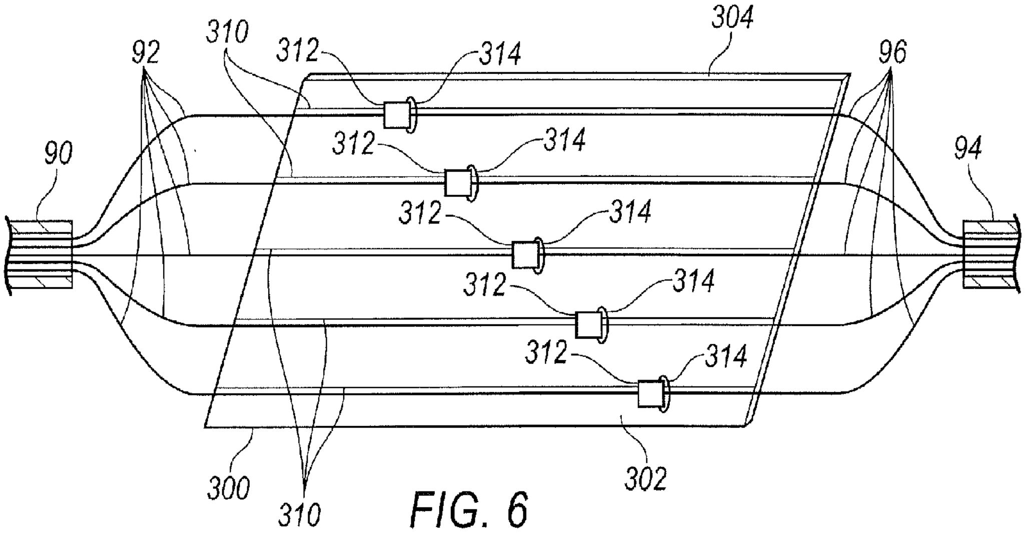
FIG. 6 is a perspective view of a media retaining mat of the media distribution hub of FIG. 1 with media disposed on the media retaining mat.

Media distribution hub 10 may also include a media retaining mat 300 having an upper surface 302 and a lower surface 304 that is disposed within housing 12 as shown in FIG. 6. Media retaining mat 300 may be made of a water absorbing material. Alternatively, media retaining mat 300 may include multiple layers, including a support layer disposed over a water absorbent layer. Media retaining mat 300 may further include a coating or layer to inhibit fungal growth on the media retaining mat 300. Media retaining mat 300 may include a plurality of media retainers 310, such as strings or wires, attached to the upper surface 302. Media retainers 310 are spaced apart from one another, and may be spaced such that they extend parallel to one another across media retaining mat 300.

Media 92 contained within cable 90 may extend over media retaining mat 300 and be connected to media 96 contained within cable 94 by any suitable connector 312, including but not limited to APC connectors and FCAPC connectors. Each connector 312 may then be attached to one of the media retainers 310 on the upper surface 302 of media retaining mat 300 by a securing device 314, such as a clip.

Figure 7:
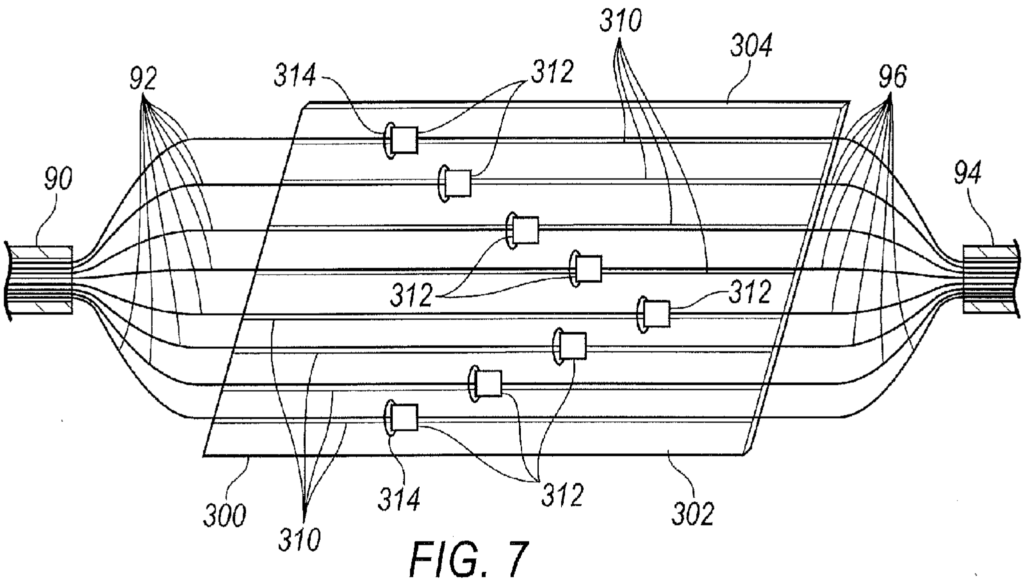
FIG. 7 is an illustration of the media retaining mat of FIG. 6 with the media disposed on the media retaining mat in an alternate arrangement.

As shown in FIG. 6, only one connector 312 is attached to each media retainer 310. Alternatively, multiple connectors 312 may be attached to the same media retainer 310. Further, each of the connectors 312 may be offset from the other connectors 312 such that none of the connectors 312 are directly above or below any of the other connectors 312. Connectors 312 may be arranged in a variety of offset patterns on media retaining mat 300, and exemplary illustrations of such arrangements are shown in FIGS. 6 and 7.

Alternatively, media retainers 310 may include a plurality of spaced apart grooves in the upper surface 302 of the media retaining mat 300 such that each groove receives a connector 312 and the associated media 92, 96 connected by the connector 312.

Figure 8:
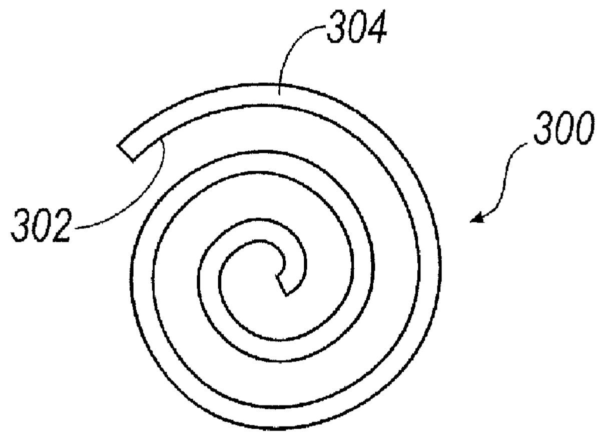
FIG. 8 is an end view of the media retaining mat of FIG. 6 after the media retaining mat has been rolled up.

After the connectors 312 have been attached to the strings 310 on the media retaining mat 300, the media retaining mat 300 may be rolled up into a generally cylindrical shape as shown in FIG. 8. Rolling media retaining mat 300 into the generally cylindrical shape encases the connectors 312 within media retaining mat 300, isolating the connectors 312 from contaminants that may enter housing 12. Further, the water absorbing material of media retaining mat 300 will also serve to prevent water from getting into connectors 312.

As the connectors 312 are attached to the media retaining mat 300 in an offset manner, the rolled-up media retaining mat 300 can also maintain a low profile. The rolled-up media retaining mat 300 containing the connectors 312 and media 92, 96 is inserted into the first and second housing members 14, 50 such that upon engagement of the first and second housing members 14, 50 with each other, the media retaining mat 300 is fully contained within housing 12.

Figure 9:
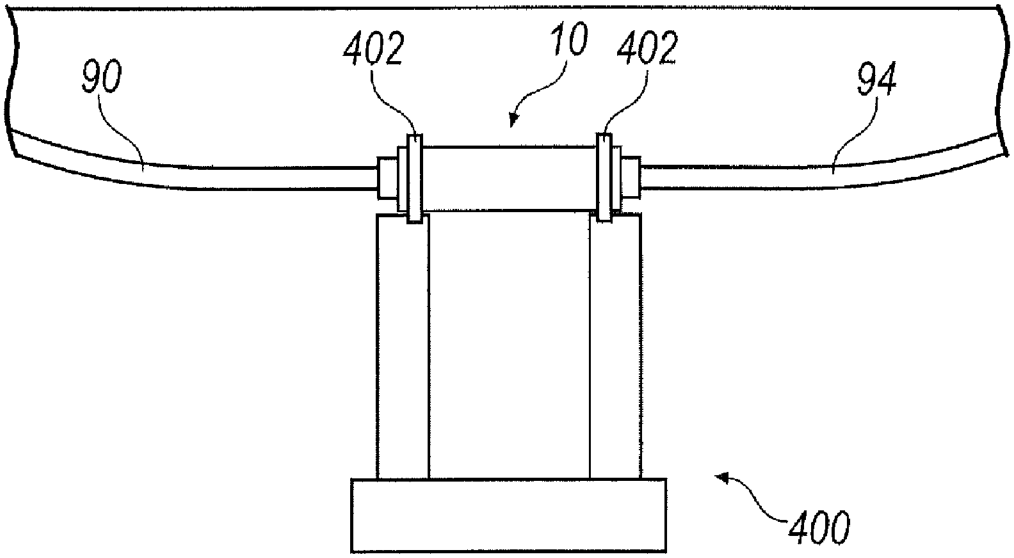
FIG. 9 is a perspective view of the media distribution hub of FIG. 1 connected to a frame mount.

The media distribution hub 10 may be attached to a mounting frame 400, FIG. 9, to stabilize the media distribution hub 10 when the media distribution hub 10 is buried underground. Mounting frame 400 shown in FIG. 9 is shown merely for illustrative purposes as media distribution hub 10 may be mounted to any suitable mounting frame. Media distribution hub 10 may be mounted to mounting frame 400 by any suitable fastening mechanism 402, FIGS. 1 and 9, including, but not limited to, rings or clips. Alternatively, media distribution hub 10 may be buried underground without a mounting frame.

To assemble the media distribution hub 10, fasteners and base sealing members 206 may be disposed about cables 90, 94. Next, first housing member 14 with first sleeve member 102 disposed about the first housing member 14 may be disposed about cable 90, and second housing member 50 with second sleeve member 130 disposed about the second housing member 50 may be disposed about cable 94. Next, media retaining mat 300 may be provided and media 92, 96 contained within cables 90, 94 connected to one another by connectors 312. Connectors 312 may then be attached to the strings 310 of media retaining mat 300 by securing devices 314. First and second housing members 14, 50 are then brought into sealed engagement with each other, forming housing 12. First and second sleeve members 102, 130 are then brought into threaded engagement with each other, locking the first and second housing members 14, 50 together and forming a further seal about the connection of the first and second housing members 14, 50. Finally, locking nuts 200 are brought into threaded engagement with first and second housing members 14, 50 to form seals about the ends of housing 12. The assembled media distribution hub 10 is sealed such that contaminants such as water and dirt are prevented from entering into housing 12 and interfering with media connections made within media distribution hub 10.

To access the media 92, 96 contained within media distribution hub 10 after the hub 10 has been buried underground, the media distribution hub 10 must first be removed from the ground. If the media distribution hub 10 is attached to a mounting frame, the hub may be detached from the mounting frame prior to, or after, the hub has been removed from the ground. Then the fasteners illustrated in the form of locking nuts 200, 220, are unscrewed from the ends 16, 54 of the housing 12. Next, first sleeve member 102 and second sleeve member 130 are detached from one another, unlocking and unsealing the first and second housing members 14, 50. Then, first housing member 14 and second housing member 50 are disengaged from one another. This allows access to media retaining mat 300 contained within housing 12. Media retaining mat 300 may then be unrolled to provide access to media 92, 96 and connectors 312. Connectors 312 may be adjusted or replaced, or additional connections between media 92, 96 may be made.

With regard to the processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in now way be construed so as to limit the claimed invention.

It is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. A media distribution hub comprising:

a housing including a first housing member and a second housing member configured for releasable sealing engagement with one another, a sleeve having a first sleeve member and a second sleeve member and disposed about at least a portion of each of the first housing member and second housing member, the first sleeve member and second sleeve member configured to releasably lock the first housing member and the second housing member together and to provide a seal about the first and second housing members, a media retaining mat disposed within at least a portion of one of the first housing member and second housing member, and a plurality of fasteners, at least one of the fasteners configured for engagement with the first housing member, and at least one of the fasteners configured for engagement with the second housing member.

2. The media distribution hub of claim 1, wherein the first housing member includes a first end and a second end, and a base at the first end of the first housing member having an outer surface and an inner surface defining an aperture therethrough, and the second housing member having a first end and a second end, and a base at the second end of the second housing member having an outer surface and an inner surface defining an aperture therethrough.

3. The media distribution hub of claim 2, wherein the first housing member further includes an annular wall having an inner surface and an outer surface extending from the inner surface of the base, and the second housing member further includes an annular wall having an inner surface and an outer surface extending from the inner surface of the base.

4. The media distribution hub of claim 3, wherein the annular wall of the first housing member includes a beveled edge at the second end of the first housing member, and the annular wall of the second housing member includes a shoulder proximate the first end of the second housing member and a beveled edge extending from the shoulder to the second end of the first housing member, the beveled edge of the first housing member and the beveled edge of the second housing member configured for engagement with each other.

5. The media distribution hub of claim 4, further including a housing sealing member disposed between the second end of the first housing member and the first end of the second housing member.

6. The media distribution hub of claim 2, further including a first annular flange having a first face and a second face disposed about the first housing member proximate the second end of the first housing member, and a second annular flange having a first face and a second face disposed about the second housing member proximate the first end of the second housing member.

7. The media distribution hub of claim 6, further including a first sleeve sealing member disposed about the first housing member and against the first face of the first annular flange of the first housing member, and a second sleeve sealing member disposed about the second housing member and against the second face of the second annular flange of the second housing member.

8. The media distribution hub of claim 7, wherein the first sleeve member has a first end and a second end, the first sleeve member including a base at the first end of the first sleeve member including an aperture for receiving the first housing member, the first sleeve member disposed about the first housing member such that the first annular flange of the first housing member is located between the base of the first sleeve member and the second end of the first housing member, and wherein the second sleeve member has a first end and a second end, the second sleeve member including a base at the second end of the second sleeve member including an aperture for receiving the second housing member, the second sleeve member disposed about the second housing member such that the second annular flange of the second housing member is located between the base of the second sleeve member and the first end of the second housing member.

9. The media distribution hub of claim 8, wherein a region of the second end of the first sleeve member and a region of the first end of the second sleeve member are configured for threaded engagement with each other.

10. The media distribution hub of claim 9, wherein upon threaded engagement of the first and second sleeve members, the first sleeve sealing member is compressed between the base of the first sleeve member and the first face of the first annular flange of the first housing member, and the second sleeve sealing member is compressed between the base of the second sleeve member and the second face of the second annular flange of the second housing member.

11. The media distribution hub of claim 2, wherein the base of the first housing member includes a threaded base projection having a bore therethrough, and wherein the base of the second housing member includes a threaded base projection having a bore therethrough.

12. The media distribution hub of claim 11, wherein a first base sealing member is disposed against the threaded base projection of the first housing member and a second base sealing member is disposed against the threaded base projection of the second housing member.

13. The media distribution hub of claim 12, wherein the plurality of fasteners includes a first locking nut configured for threaded engagement with the first housing member and a second locking nut configured for threaded engagement with the second housing member.

14. The media distribution hub of claim 13, wherein the first locking nut includes an outer surface, a nut bore and an inner thread which is threadedly engageable with the threaded base projection of the first housing member, and wherein the second locking nut includes an outer surface, a nut bore and an inner thread which is threadedly engageable with the threaded base projection of the second housing member.

15. The media distribution hub of claim 14, wherein the first base sealing member is compressed between the first locking nut and the base projection of the first housing member upon threaded engagement of the first locking nut and the base projection of the first housing member, and the second base sealing member is compressed between the second locking nut and the base projection of the second housing member upon threaded engagement of the first locking nut and the base projection of the second housing member.

16. The media distribution hub of claim 14, wherein nut projections extend from the outer surfaces of the first and second locking nuts for engagement with additional locking nuts.

17. The media distribution hub of claim 1, wherein the media retaining mat includes a plurality of media retainers on the upper surface of the media retaining mat.

18. The media distribution hub of claim 1, wherein the media retaining mat is rolled such that the media retaining mat has a generally circular cross section.

19. The media distribution hub of claim 1, wherein the media retaining mat includes a support layer disposed over a water absorbent layer.

20. The media distribution hub of claim 2, further including a first annular flange having a first face and a second face disposed about the first housing member proximate the second end of the first housing member, and a second annular flange having a first face and a second face disposed about the second housing member proximate the first end of the second housing member.

21. The media distribution hub of claim 20, wherein the first sleeve member has a first end and a second end, the first sleeve member including a base at the first end of the first sleeve member including an aperture for receiving the first housing member, the first sleeve member disposed about the first housing member such that the first annular flange of the first housing member is located between the base of the first sleeve member and the second end of the first housing member, and wherein the second sleeve member has a first end and a second end, the second sleeve member including a base at the second end of the second sleeve member including an aperture for receiving the second housing member, the second sleeve member disposed about the second housing member such that the second annular flange of the second housing member is located between the base of the second sleeve member and the first end of the second housing member.

22. A media distribution hub comprising:

a housing including a first housing member and a second housing member configured for releasable sealing engagement with one another, the first housing member having a first end and a second end, the first housing member including a base at the first end of the first housing member having an outer surface and an inner surface defining an aperture therethrough, and the second housing member having a first end and a second end, the second housing member including a base at the second end of the second housing member having an outer surface and an inner surface defining an aperture therethrough, a sleeve having a first sleeve member and a second sleeve member and disposed about at least a portion of each of the first housing member and second housing member, the first sleeve member and second sleeve member configured to lock the first housing member and the second housing member together and to provide a seal about the first and second housing members, and a plurality of fasteners, at least one of the fasteners configured for engagement with the first housing member, and at least one of the fasteners configured for engagement with the second housing member.

23. The media distribution hub of claim 22, further including a media retaining mat having an upper surface and a lower surface disposed within at least a portion of at least one of the first housing member and second housing member.

24. The media distribution hub of claim 23, wherein the media retaining mat includes a plurality of media retainers on the upper surface of the media retaining mat.

25. The media distribution hub of claim 22, wherein the base of the first housing member includes a threaded base projection having a bore therethrough, and wherein the base of the second housing member includes a threaded base projection having a bore therethrough.

* * * * *